(12) United States Patent
Qiao et al.

(10) Patent No.: US 12,349,295 B2
(45) Date of Patent: Jul. 1, 2025

(54) ELECTRONIC DEVICE AND MANUFACTURING METHOD FOR MIDDLE FRAME

(71) Applicant: Honor Device Co., Ltd., Shenzhen (CN)

(72) Inventors: Yandang Qiao, Shenzhen (CN); Lizhi Xiong, Shenzhen (CN); Wei Zhang, Shenzhen (CN); Xuyang Wang, Shenzhen (CN)

(73) Assignee: HONOR DEVICE CO., LTD., Shenzhen (CN)

( * ) Notice: Subject to any disclaimer, the term of this patent is extended or adjusted under 35 U.S.C. 154(b) by 0 days.

(21) Appl. No.: 17/913,001

(22) PCT Filed: Apr. 28, 2022

(86) PCT No.: PCT/CN2022/089708
§ 371 (c)(1),
(2) Date: Sep. 20, 2022

(87) PCT Pub. No.: WO2023/005305
PCT Pub. Date: Feb. 2, 2023

(65) Prior Publication Data
US 2024/0224442 A1 Jul. 4, 2024

(30) Foreign Application Priority Data
Jul. 29, 2021 (CN) .......................... 202110869960.1

(51) Int. Cl.
*H05K 5/02* (2006.01)
(52) U.S. Cl.
CPC ................... *H05K 5/0217* (2013.01)

(58) Field of Classification Search
CPC .......................... H05K 5/0017; H05K 5/0217
USPC ......................................... 361/807, 809, 810
See application file for complete search history.

(56) References Cited

U.S. PATENT DOCUMENTS 9,634,710 B2   4/2017   Wang et al.
2013/0322035 A1   12/2013   Hamburgen et al.

FOREIGN PATENT DOCUMENTS

| CN | 106163165 A | 11/2016 | |
|---|---|---|---|
| CN | 107087365 A | 8/2017 | |
| CN | 107717340 A | 2/2018 | |
| CN | 108289395 A | 7/2018 | |
| CN | 108966551 A | * 12/2018 | ............. B23P 15/00 |

(Continued)

*Primary Examiner* — Hung S. Bui
(74) *Attorney, Agent, or Firm* — Slater Matsil, LLP

(57) ABSTRACT

An electronic device and a manufacturing method for a middle frame are provided. The electronic device includes a middle frame, and the middle frame includes a bezel and a middle plate. The bezel is of an annular structure and is disposed around an edge of the middle plate, and the bezel includes at least two layers of annular structures. A concavo-convex fit between any two adjacent annular structures in the at least two layers of annular structures is used to locate the annular structure. The at least two layers of annular structures are respectively at least two metal materials of different densities. In this application, in a processing manner of hot forging a composite plate, the bezel, the middle plate, and a rib in the middle frame are an integrated structure, and at least two types of metal are arranged on the bezel at the same time.

21 Claims, 8 Drawing Sheets

(56) References Cited

FOREIGN PATENT DOCUMENTS

| | | | | | |
|---|---|---|---|---|---|
| CN | 109177036 | A | | 1/2019 | |
| CN | 109429458 | A | * | 3/2019 | ............... H05K 5/02 |
| CN | 110324467 | A | | 10/2019 | |
| CN | 110480923 | A | | 11/2019 | |
| CN | 110654081 | A | | 1/2020 | |
| CN | 110662376 | A | | 1/2020 | |
| CN | 110831377 | A | * | 2/2020 | ............ H01H 13/063 |
| CN | 112153191 | A | * | 12/2020 | ............... H04M 1/02 |
| CN | 112272479 | A | * | 1/2021 | ............... H01Q 1/22 |
| CN | 110024499 | B | | 2/2021 | |
| CN | 113365447 | A | * | 9/2021 | ............... H05K 5/02 |
| CN | 113795098 | A | | 12/2021 | |
| CN | 114980595 | A | * | 8/2022 | ............... H05K 5/02 |
| WO | 2018145556 | A1 | | 8/2018 | |
| WO | 2019014811 | A1 | | 1/2019 | |
| WO | 2020001331 | A1 | | 1/2020 | |

\* cited by examiner

ELECTRONIC DEVICE AND MANUFACTURING METHOD FOR MIDDLE FRAME

CROSS-REFERENCE TO RELATED APPLICATIONS

This application is a National Stage of International Application No. PCT/CN2022/089708, filed on Apr. 28, 2022, which claims priority to Chinese Patent Application No. 202110869960.1, filed Jul. 29, 2021, both of which are hereby incorporated by reference in their entireties.

TECHNICAL FIELD

This application relates to the field of communication technologies, and in particular, to an electronic device and a manufacturing method for a middle frame.

BACKGROUND

A middle frame is a structural framework of an electronic device, one side of the middle frame is assembled with a rear cover, and the other side thereof is assembled with a screen. A battery compartment in which a battery is placed and a fixed structure for mounting a component are disposed on the middle frame. In a process in which a user uses the electronic device, in addition to a function of carrying an electronic device part, the middle frame further needs to withstand impact from an external environment to protect the electronic device. Therefore, a stiffness requirement for the middle frame is relatively high. A metal middle frame has excellent performance of high strength, high hardness, and high abrasion resistance, and can protect the electronic device while being light and thin. Therefore, it is widely used.

The metal middle frame consists of a bezel and a middle plate, and is a metal semifinished part with the bezel and the middle plate respectively as a single-layer structure formed by a process such as die casting or forming with a titanium alloy or stainless steel as a main material of the metal middle frame. Then, an injection molding position structure such as an antenna groove is disposed on the metal semifinished part by using machining. Finally, nano molding is used to perform in-mold injection molding on a structure such as an injection molding position to complete plastic filling.

However, the foregoing middle frame has a problem that overall stiffness of the electronic device is weak because of a small metal proportion of the bezel.

SUMMARY

Embodiments of this application provide an electronic device and a manufacturing method for a middle frame, so as to resolve a problem that overall stiffness of the electronic device is weak because of a small metal proportion of a bezel.

According to a first aspect, this application provides an electronic device, including a middle frame, and the middle frame includes a bezel and a middle plate. The bezel is of an annular structure and is disposed around an edge of the middle plate, and the bezel includes at least two layers of annular structures. A concavo-convex fit between any two adjacent annular structures in the at least two layers of annular structures is used to locate the annular structure. The at least two layers of annular structures are respectively at least two metal materials of different densities.

In this way, the bezel includes the at least two layers of annular structures, so that the bezel includes at least two or more types of metals, thereby increasing a metal proportion of the bezel, and improving overall stiffness. In two types of metal of same weight, metal with a smaller density has a larger volume, for example, aluminum and stainless steel, and a volume of the aluminum is greater than a volume of the stainless steel. If a height of the bezel remains unchanged, a thickness of the aluminum in a horizontal direction is greater than a thickness of the stainless steel in the horizontal direction. Therefore, when an inner layer structure uses lightweight metal (such as aluminum), a volume proportion of metal of the middle frame is greater under same weight. For the aluminum and the stainless steel of a same thickness, a weight of the aluminum is lighter. Therefore, when the inner layer structure uses the lightweight metal (such as the aluminum), weight of the middle frame is lighter. That is, a method that the lightweight metal different from a material of an outer layer structure is used for the inner layer structure is used to implement a weight reduction effect.

In an implementation, the at least two layers of annular structures include the inner layer structure and the outer layer structure. The outer layer structure is attached to an outer side of the inner layer structure, and a density of the outer layer structure is greater than a density of the inner layer structure. The inner layer structure and the middle plate are an integrated structure.

In an implementation, a thickness of the inner layer structure in a horizontal direction of the middle frame is greater than a thickness of the outer layer structure in the horizontal direction of the middle frame. The thickness of the outer layer structure in the horizontal direction is less than the thickness of the inner layer structure in the horizontal direction, so that a proportion of the metal can be increased and weight can be reduced to achieve a balance.

In an implementation, there is a middle layer structure, the middle layer structure is disposed between the inner layer structure and the outer layer structure, a binding force of the middle layer structure and the outer layer structure is greater than a binding force of the outer layer structure and the inner layer structure, and a binding force of the middle layer structure and the inner layer structure is greater than the binding force of the outer layer structure and the inner layer structure;

In this way, by adding the middle layer structure, different metal is respectively used in the middle layer structure, the inner layer structure, and the outer layer structure. When metal bonding strength of the inner layer structure and the outer layer structure is relatively weak, metal of the introduced middle layer structure has better bonding strength with metal used in the inner layer structure and metal used in the outer layer structure respectively, so that bonding strength of a composite plate (that is, first metal, second metal, and third metal) is improved, that is, binding strength of the bezel is improved.

In an implementation, the middle frame further includes a rib. The rib is disposed on the middle plate, and two ends of the rib are respectively connected to an inner side of the bezel. The rib, the middle plate, and the inner layer structure surround to form a first accommodating space, and the first accommodating space is configured to accommodate a battery. The rib and the middle plate are an integrated structure. The middle plate includes an integrally formed rib, so as to improve reliability of the first accommodating space for accommodating the battery. By setting the rib as metal, a metal volume proportion is further increased.

In an implementation, the middle frame further includes an antenna groove. The antenna groove is disposed on the bezel. A plastic part is disposed in the antenna groove. The plastic part is connected to the bezel and the middle plate.

In a processing manner of hot forging the composite plate, the bezel, the middle plate, and the rib in the middle frame may be an integrated structure. The bezel is an integrated structure with at least two layers, that is, at least two types of metal are arranged on the bezel at the same time. In this way, the metal proportion of the bezel is increased, and overall stiffness is improved. In addition, this application avoids that the middle frame is obtained in a split (including welding or riveting) manner, so that a middle frame processing step is reduced, machining time is reduced, and costs are reduced.

According to a second aspect, this application provides a manufacturing method for a middle frame, and the manufacturing method includes: hot forging a composite plate to obtain a semifinished part of a middle frame, where the composite plate consists of at least two layers of metal. The semifinished part of the middle frame includes a bezel and a middle plate. The bezel is of an annular structure and is disposed around an edge of the middle plate, and the bezel includes at least two layers of annular structures. A concavo-convex fit between any two adjacent annular structures in the at least two layers of annular structures is used to locate the annular structure. The at least two layers of annular structures are respectively at least two metal materials of different densities.

In this way, in a method for hot forging the composite plate, deformation resistance is reduced by heating, so that the semifinished part with a thickness greater than 5 mm can be formed, thereby increasing a metal volume proportion of the middle frame and further improving stiffness.

In an implementation, the composite plate consists of an upper layer of metal and a lower layer of metal. The lower layer of metal is first metal, and the upper layer of metal is second metal. The at least two layers of annular structures include an inner layer structure and an outer layer structure. The outer layer structure is attached to an outer side of the inner layer structure, and a density of the outer layer structure is greater than a density of the inner layer structure. The inner layer structure and the middle plate are an integrated structure. A material of the outer layer structure is the first metal. A material of the inner layer structure is the second metal. A material of the middle plate is the second metal.

In an implementation, the composite plate consist of an upper layer of metal, a middle layer of metal, and a lower layer of metal that are respectively first metal, second metal, and third metal. The at least two layers of annular structures further include a middle layer structure. The middle layer structure is disposed between an inner layer structure and an outer layer structure, a binding force of the middle layer structure and the outer layer structure is greater than a binding force of the outer layer structure and the inner layer structure, and a binding force of the middle layer structure and the inner layer structure is greater than the binding force of the outer layer structure and the inner layer structure. A material of the outer layer structure is the first metal. A material of the inner layer structure is the second metal. A material of the middle plate is the second metal. A material of the middle layer structure is the third metal.

In an implementation, a back extrusion rib is disposed on the hot-forged forging mold, and the back extrusion rib is configured to form a rib on the middle plate. The rib is disposed on the middle plate, and two ends of the rib are respectively connected to an inner side of the bezel. The rib, the middle plate, and the inner layer structure surround to form a first accommodating space, and the first accommodating space is configured to accommodate a battery. The rib and the middle plate are an integrated structure. A material of the rib is the second metal. The rib and the middle plate are integrally formed.

In an implementation, the manufacturing method for a middle frame further includes: performing machining on the semifinished part of the middle frame, so as to form shape and inner cavity structure features to obtain an injection molding position of the middle frame; and performing nano molding on the injection molding position of the middle frame to perform plastic filling on the middle frame.

An outer profile uses a forging manner to perform partial forming and obtain a required shape, so as to reduce a subsequent machining amount. This application avoids that the middle frame is obtained in a split (including welding or riveting) manner, so that a middle frame processing step is reduced, machining time is reduced, and costs are reduced.

BRIEF DESCRIPTION OF THE DRAWINGS

FIG. 5b is a schematic sectional view of an A-A part of the middle frame shown in FIG. 5a;

FIG. 5c is a schematic diagram of a structure of a rib in the middle frame shown in FIG. 5a;

FIG. 6 is a schematic diagram of a structure of an antenna groove in the middle frame shown in FIG. 5a;

FIG. 8b is a schematic sectional view of a B-B part of the middle frame shown in FIG. 8a.

DETAILED DESCRIPTION OF ILLUSTRATIVE EMBODIMENTS

An electronic device according to an embodiment of this application may include, for example, a mobile terminal, a tablet computer, a personal computer, a workstation device, a large screen device (for example, a smart screen and an intelligent television), a handheld game console, a home game console, a virtual reality device, an augmented reality device, a mixed reality device, an intelligent vehicle terminal, a self-driving vehicle, customer-premises equipment (customer-premises equipment, CPE), and the like.

Figure 1:
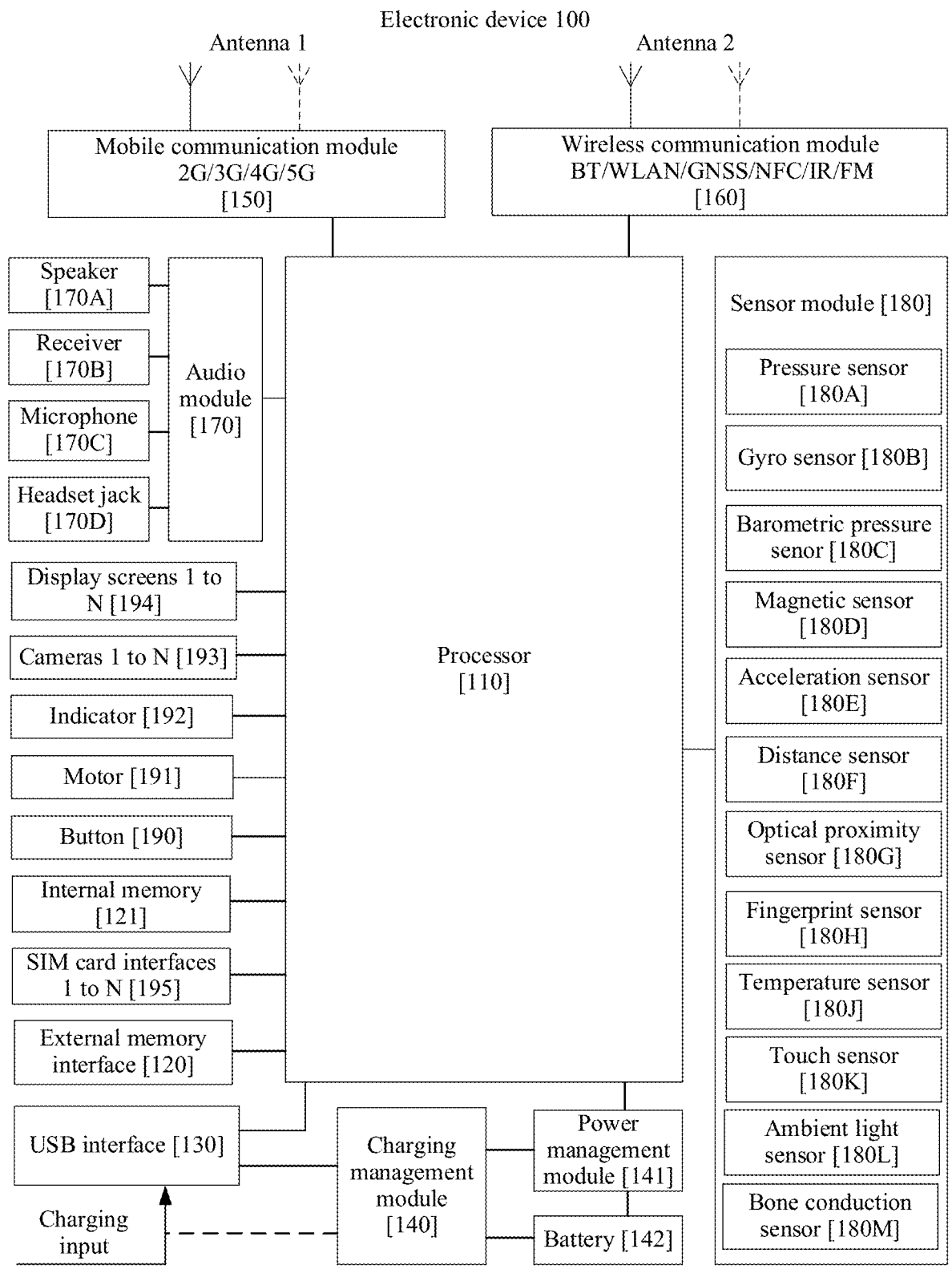
FIG. 1 is a schematic diagram of a structure of an electronic device 100.

FIG. 1 is a schematic diagram of a structure of an electronic device 100. As shown in FIG. 1, the electronic device 100 may include a processor 110, an external memory interface 120, an internal memory 121, a universal serial bus (universal serial bus, USB) interface 130, a charging management module 140, a power management module 141, a battery 142, an antenna 1, an antenna 2, a mobile communication module 150, a wireless communication module 160, an audio module 170, a speaker 170A, a receiver 170B, a microphone 170C, a headset jack 170D, a sensor module 180, a button 190, a motor 191, an indicator 192, a camera 193, a display 194, and a subscriber identity module (subscriber identification module, SIM) card interface 195, and the like. The sensor module 180 may include a pressure sensor 180A, a gyro sensor 180B, a barometric pressure sensor 180C, a magnetic sensor 180D, an acceleration sensor 180E, a distance sensor 180F, an optical proximity sensor 180G, a fingerprint sensor 180H, a temperature sensor 180J, a touch sensor 180K, an ambient light sensor 180L, a bone conduction sensor 180M, and the like.

It may be understood that a structure shown in this embodiment of the present invention does not constitute a specific limitation on the electronic device 100. In some other embodiments of this application, the electronic device 100 may include more or fewer components than those shown in the figure, or combine some components, or split some components, or have different component arrangements. The component shown in the figure may be implemented by hardware, software, or a combination of software and hardware.

Figure 2:
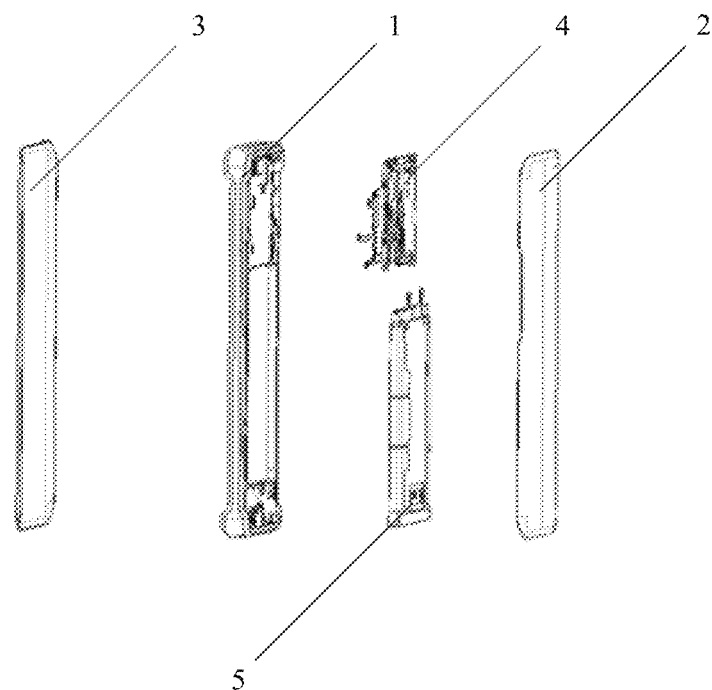
FIG. 2 is a schematic diagram of a split structure of an electronic device.

FIG. 2 is a schematic diagram of a split structure of an electronic device according to an embodiment of this application. As shown in FIG. 2, the structure of the electronic device includes a middle frame 1, a rear cover 2, and a screen 3, and further includes a front cover. The middle frame 1 is one of important components in the structure of the electronic device, the middle frame 1 is configured to fix or move the rear cover 2, the screen 3, and an internal component, and a bracket 4 and a battery 5 are disposed between the middle frame 1 and the rear cover 2. When the electronic device is assembled, one side of the middle frame 1 is assembled with the screen 3, and has a function of being an interlayer between the screen 3 and an electronic part. The other side of the middle frame 1 is assembled with the rear cover 2 to protect an electronic component in the electronic device from impact. In addition, the middle frame 1 also provides a more reliable mounting substrate for each electronic component, for example, the bracket 4 and the battery 5 are installed on the middle frame 1. It can be learned that the middle frame 1 has a function of supporting and carrying a core component. Therefore, there are many requirements in terms of strength, structure, and heat dissipation performance.

Figure 3A:
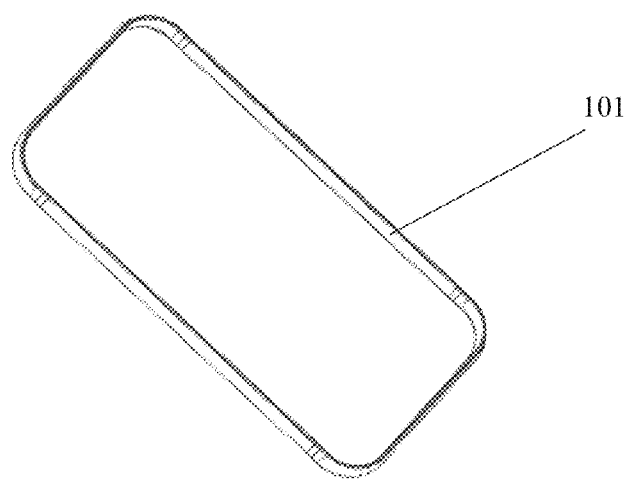
FIG. 3a is a schematic diagram of a structure of a bezel in a middle frame of an electronic device.
Figure 3B:
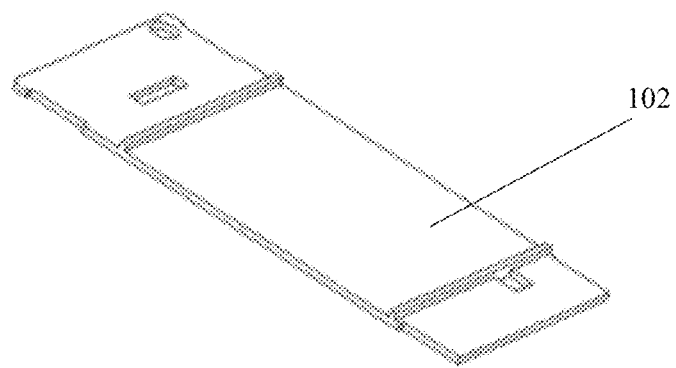
FIG. 3b is a schematic diagram of a structure of a middle plate in a middle frame of an electronic device.

A metal middle frame has excellent performance of high strength, high hardness, and high abrasion resistance. In addition to being light and thin, the metal middle frame can also protect the electronic component in the electronic device from impact, and avoid screen damage due to external impact. Therefore, more and more electronic devices start to use a metal middle frame. FIG. 3a is a schematic diagram of a structure of a bezel in a middle frame of an electronic device. FIG. 3b is a schematic diagram of a structure of a middle plate in a middle frame of an electronic device. Referring to FIG. 3a and FIG. 3b, the middle frame 1 consists of a bezel 101 and a middle plate 102. The bezel 101 is of an annular structure and is disposed around an edge of the middle plate 102, and the bezel 101 and the middle plate 102 may be stamped by using a metal plate. In this case, the bezel 101 and the middle plate 102 are an integrated structure. The bezel 101 and the middle plate 102 may also be separately formed. For example, the bezel 101 is a section-bending part, the middle plate 102 is a die casting part, and the bezel 101 and the middle plate 102 are connected together in a welding manner. Regardless of being integrally formed or welded, selection of materials of the bezel 101 and the middle plate 102 generally considers a stiffness feature and a heat dissipation feature of the metal. For example, the bezel 101 is configured to connect the screen 3 and the rear cover 2. Therefore, considering the structural strength and a stiffness requirement of the bezel 101, the material of the bezel 101 should preferably select stainless steel or titanium alloy, for example, stainless steel SUS304 or SUS316L. The middle plate 102 is mainly used to fix the internal component, so that the middle plate 102 selects metal with relatively good heat dissipation performance, such as aluminum or magnesium, for example, aluminum alloy AL6063 or AL7075 (aviation aluminum). A common combination of the middle frame in a current electronic device is: The bezel 101 is stainless steel, and the middle plate 102 is aluminum alloy. In this way, the bezel 101 and the middle plate 102 are connected together in a welding or riveting manner.

Figure 4:
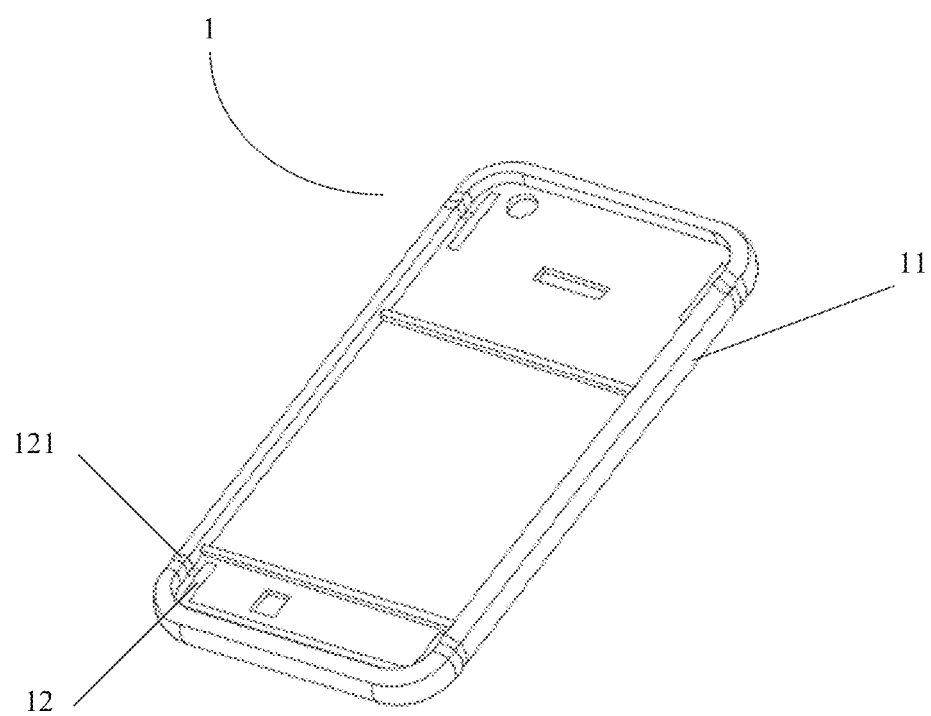
FIG. 4 is a schematic diagram of a structure of a middle frame of an electronic device.

In addition, considering a requirement on an electromagnetic and insulation aspect of the electronic device, some structures or regions in the metal middle frame are set as injection molding materials, such as an antenna groove. Generally, machining is performed on a semifinished part of the middle frame that is formed by metal processing to obtain an injection molding position, and a plastic structure is obtained by using a nano molding process in the injection molding position. FIG. 4 is a schematic diagram of a structure of a middle frame of an electronic device. As shown in FIG. 4, the middle frame 1 includes a metal structure 11 and a plastic structure 12, and the plastic structure 12 further includes a plastic part 121 that is disposed at a gap of an antenna groove. A battery compartment rib is further disposed on a middle plate of the electronic device, and is configured to fix a battery, and is also generally a plastic structure.

To increase a metal volume proportion of the middle frame, thereby improving overall stiffness of the electronic device, this application provides a middle frame and a manufacturing method for a middle frame.

Figure 5A:
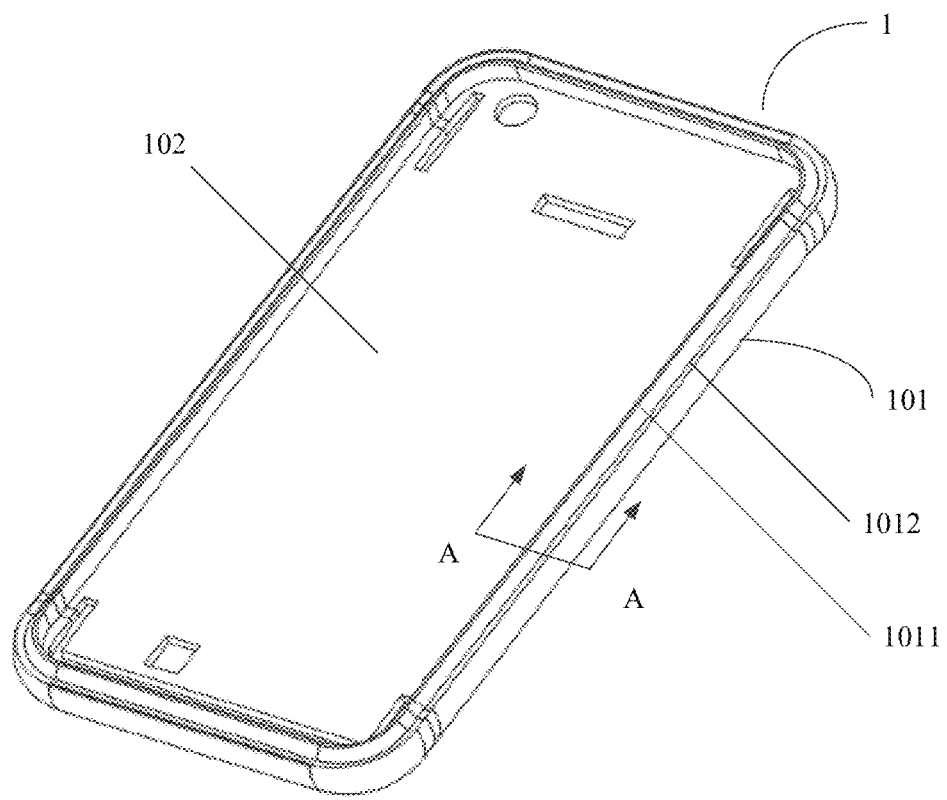
FIG. 5a is a schematic diagram of a structure of an embodiment of a middle frame according to an embodiment of this application.

FIG. 5a is a schematic diagram of a structure of an embodiment of a middle frame according to an embodiment of this application.

As shown in FIG. 5a, the middle frame 1 includes a bezel 101 and a middle plate 102. The bezel 101 is of an annular structure and is disposed around an edge of the middle plate 102. The bezel 101 consists of an inner layer structure 1011 and an outer layer structure 1012.

Figure 5B:
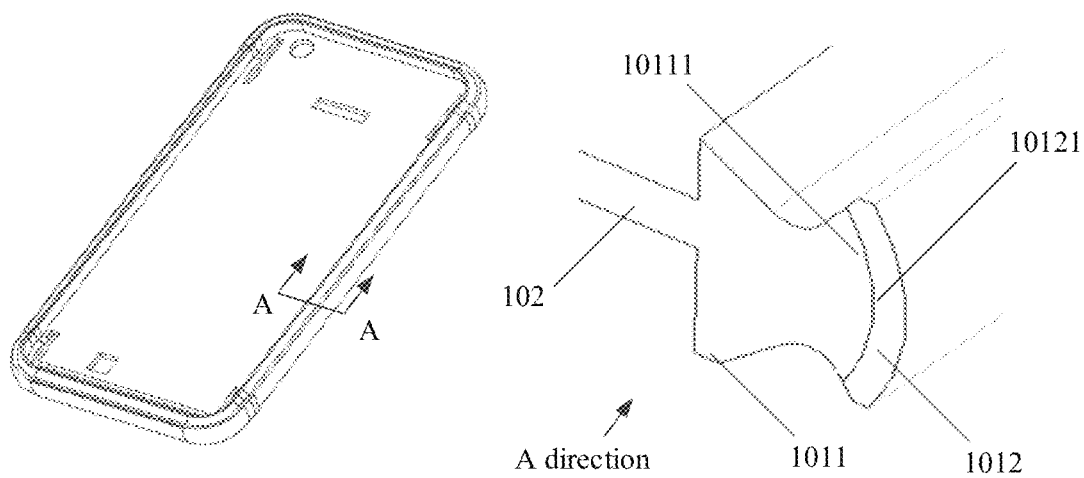

FIG. 5b is a schematic sectional view of an A-A part of the middle frame shown in FIG. 5a. As shown in FIG. 5b, the inner layer structure 1011 includes a first arc surface 10111 that protrudes in a direction away from the middle frame. The outer layer structure 1012 includes a second arc surface 10121 that matches a shape and a size of the first arc surface 10111 in a direction facing the middle frame, and the second arc surface 10121 is attached to the first arc surface 10111. To implement that the outer layer structure 1012 is tightly attached to the inner layer structure 1011, the outer layer structure 1012 is clamped to the inner layer structure 1011.

In this way, the outer layer structure 1012 cannot move up and down relative to the inner layer structure 1011, and a case in which structures are separated from each other is not prone to occur in the bezel 101 that consists of the inner layer structure 1011 and the outer layer structure 1012.

In an embodiment, a thickness of the outer layer structure 1012 in a horizontal direction is less than a thickness of the inner layer structure 1011 in the horizontal direction. To meet an appearance requirement and a stiffness requirement of the middle frame, the outer layer structure 1012 may select metal with a higher density than that of the inner layer structure 1011. Therefore, for a lighter overall weight, the thickness of the outer layer structure 1012 in the horizontal direction may be less than the thickness of the inner layer structure 1011 in the horizontal direction.

It may be learned from the foregoing embodiments that the bezel of the middle frame provided in this embodiment of this application is set as a two-layer structure, which increases a metal volume proportion of the bezel, thereby improving stiffness of the entire device. It may be understood that in two types of metal of same weight, metal with a smaller density has a larger volume, for example, aluminum and stainless steel, a volume of the aluminum is greater than a volume of the stainless steel. If a height of the bezel remains unchanged, a thickness of the aluminum in a horizontal direction is greater than a thickness of the stainless steel in the horizontal direction. Therefore, when the inner layer structure uses lightweight metal (such as aluminum), the volume proportion of the metal of the middle frame is greater under the same weight. For the aluminum and the stainless steel of a same thickness, a weight of the aluminum is lighter than that of the stainless steel. Therefore, when the inner layer structure uses the lightweight metal (such as aluminum), a weight of the middle frame is lighter. The thickness of the outer layer structure in the horizontal direction is less than the thickness of the inner layer structure in the horizontal direction, so that a proportion of the metal can be increased and weight can be reduced to achieve a balance.

In a specific implementation of the foregoing embodiment, when the middle plate and the inner layer structure may use the lightweight metal (such as aluminum), and the outer layer structure may use metal (such as stainless steel or titanium) that meets the appearance requirement, the proportion of the metal is increased, and a requirement of reducing overall device weight is met, thereby balancing the two. A problem that the overall stiffness of the electronic device is weak because of a small metal proportion of the bezel is resolved. In addition, the middle plate uses the aluminum with good heat dissipation performance, which can greatly improve heat dissipation performance of the entire device.

In an embodiment, the inner layer structure 1011 and the outer layer structure 1012 are an integrated structure. Preferably, in an implementation, the inner layer structure 1011 and the outer layer structure 1012 that are integrally formed are obtained in a processing manner of forging the composite plate. In this way, although the inner layer structure 1011 and the outer layer structure 1012 are two different metal materials, that the inner layer structure 1011 and the outer layer structure 1012 are connected in a welding or riveting manner can be avoided in the processing manner of forging the composite plate. It may be understood that the composite plate herein is an upper-lower layer plate that consists of two types of metal. For ease of description, a lower layer of metal of the composite plate is referred to as first metal, and an upper layer of metal of the composite plate is referred to as second metal. "First" and "second" are intended to distinguish between two different types of metal in terms of description, and do not produce a limitation on this application. In an example, a material of the outer layer structure 1012 is the first metal, and materials of the middle plate 102 and the inner layer structure 1011 are the second metal. The first metal on the bezel may be of a uniform thickness or a non-uniform thickness, and a maximum thickness is less than or equal to 2 mm. The second metal on the bezel is a non-uniform thickness, and a maximum thickness is greater than or equal to 3.0 mm.

In an embodiment, as shown in FIG. 5*b*, the inner layer structure 1011 and the middle plate 102 are an integrated structure. Preferably, the inner layer structure 1011 and the middle plate 102 are obtained in the processing manner of forging the composite plate. The composite plate is an upper-lower layer plate that consists of two types of metal, and the upper layer of metal is used to obtain the inner layer structure 1011 and the middle plate 102 by a processing manner of hot forging.

Figure 5C:
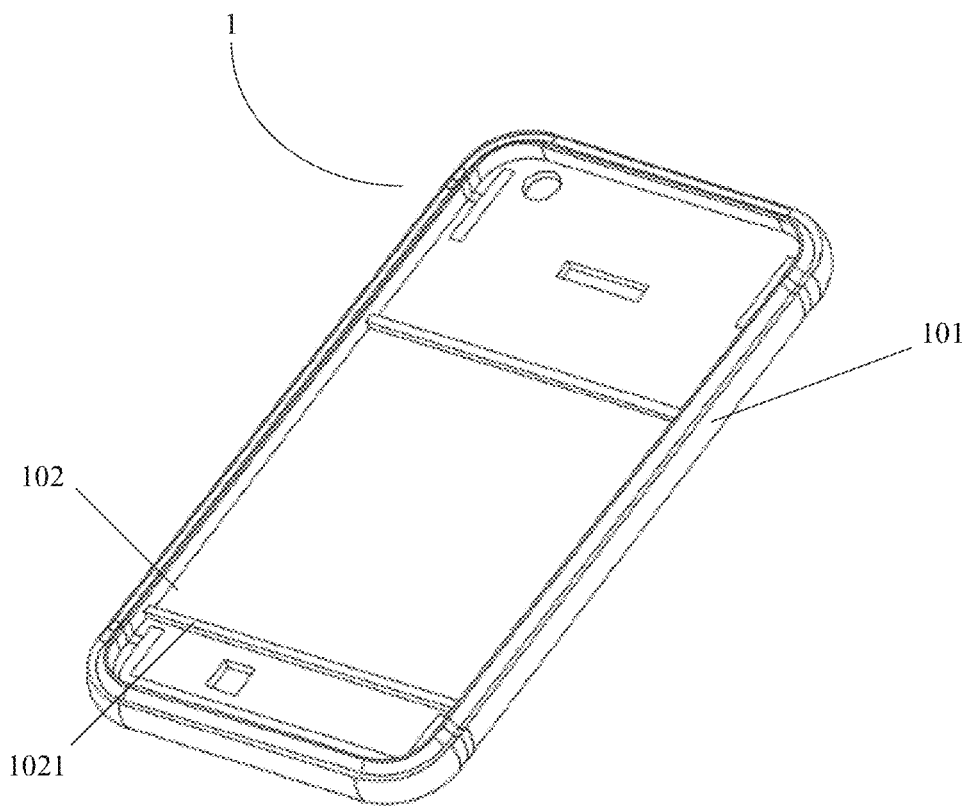

In an embodiment, FIG. 5*c* is a schematic diagram of a structure of a rib in the middle frame shown in FIG. 5*a*. As shown in FIG. 5*c*, a rib 1021 is disposed on the middle plate 102, and the rib 1021 is disposed across the middle plate 102, and extends from one end of the bezel 101 to the other end of the bezel 101. Two such ribs 1021 are disposed to form a battery compartment for fixing a battery. In an embodiment, the rib 1021 and the middle plate 102 are an integrated structure. Preferably, an integrally formed rib 1021 and middle plate 102 are obtained in the processing manner of forging the composite plate, that is, a mold cavity corresponding to the rib is disposed on a forging mold, so that the rib 1021 and the middle plate 102 have consistent metal materials. In this manner, stiffness of the battery compartment can be further improved, and a metal volume proportion can be increased.

Figure 6:
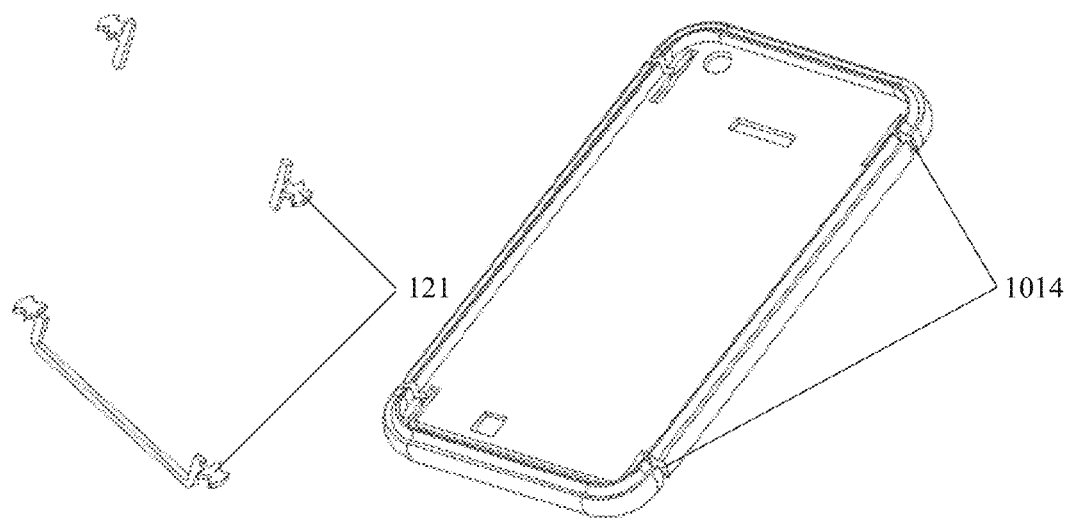

In an embodiment, FIG. 6 is a schematic diagram of a structure of an antenna groove in the middle frame shown in FIG. 5*a*. As shown in FIG. 6, an antenna groove 1014 is disposed on the bezel 101, and a plastic part 121 is injection molded into the antenna groove 1014. The plastic part 121 may be formed in the antenna groove 1014 in a nano molding processing manner. It may be understood that specific shapes of the antenna groove and the plastic part are not limited in this application. It may be understood that plastic may be poly phenylene sulfide (poly phenylene sulfide, PPS), poly butylene terephthalate (poly butylene terephthalate, PBT), polyamide (polyamide, PA), polyhthalamide (polyhthalamide, PPA), or another type of resin, and a glass fiber with a content of 10% to 60% by weight is added based on needs.

In this way, after nano injection molding is completed, a material of a structure of more than 60% of a volume of the middle frame is metal.

Figure 7A:
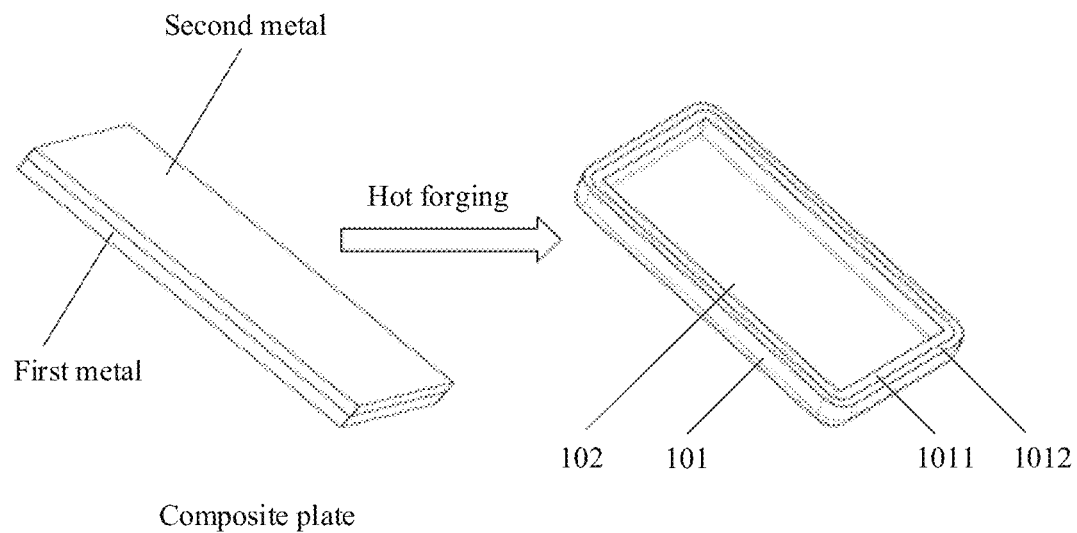
FIG. 7a is a schematic diagram of an embodiment of a manufacturing method for a middle frame according to an embodiment of this application.

To implement a structural setting of the foregoing first middle frame, an embodiment of this application provides a manufacturing method for a middle frame. FIG. 7*a* is a schematic diagram of a flowchart of an embodiment of a manufacturing method for a middle frame according to an embodiment of this application. As shown in FIG. 7*a*, the manufacturing method for a middle frame includes:

S01: Obtain a semifinished part of the middle frame in a processing manner of hot forging a composite plate that consists of two layers of metal (that are respectively first metal and second metal).

The semifinished part of the middle frame includes a bezel 101 and a middle plate 102. The bezel 101 is of an annular structure and is disposed around an edge of the middle plate 102, and the bezel 101 consists of an inner layer structure 1011 and an outer layer structure 1012. A material of the outer layer structure 1012 is the first metal, and materials of the middle plate 102 and the inner layer structure 1011 are the second metal. Referring to FIG. 5b, under a metallographic microscope, there is a clear interface between the first metal and the second metal on the bezel. It may be understood that a structure formed by the first metal and the second metal can be an integrated structure by controlling a related parameter such as a binding force.

The processing manner of hot forging the composite plate has a prominent advantage over other processing manners. Stamping forming is used as an example. Only a composite plate of aluminum alloy and stainless steel with a thickness less than 3.5 mm can be processed in a stamping processing manner. However, a composite plate with a thickness greater than 5 mm can be formed in the hot forging processing manner. In addition, as a thickness of a plate increases, in other processing manners except forging, there is a problem that a lower limit of a formable rounded corner gradually increases, and a requirement of a mechanical part cannot be met. In addition, there is a problem that a molding force gradually increases, and a common machine station cannot meet a processing requirement. These problems can be solved by hot forging.

Figure 7B:
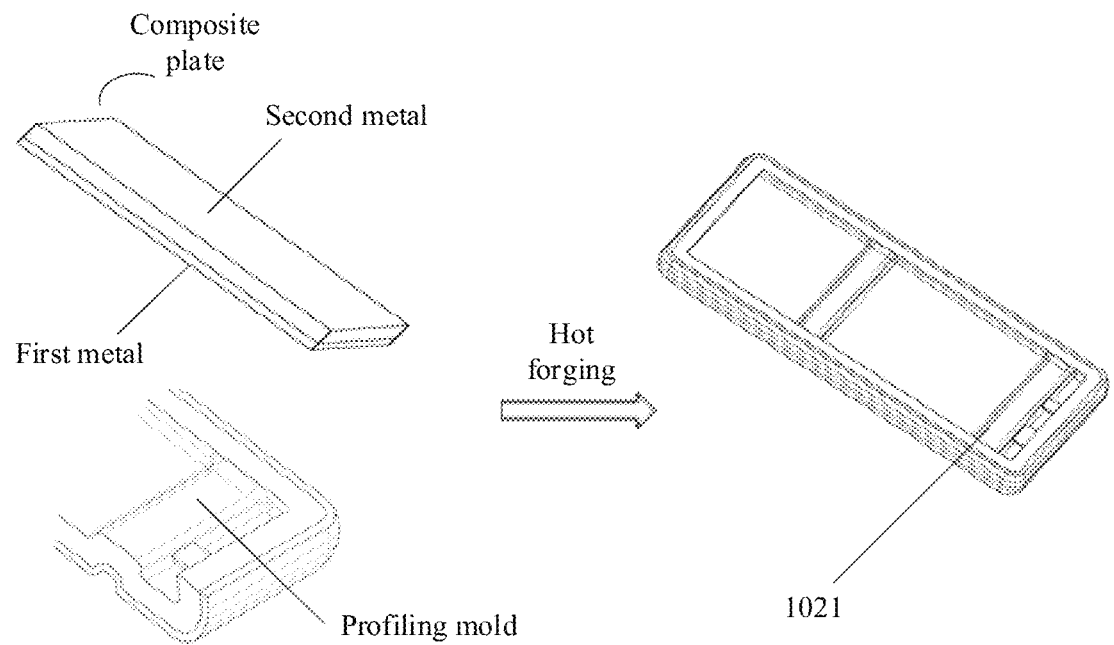
FIG. 7b is a schematic diagram of another embodiment of a manufacturing method for a middle frame according to an embodiment of this application.

In an embodiment, FIG. 7b is a schematic diagram of another embodiment of a manufacturing method for a middle frame according to an embodiment of this application. As shown in FIG. 7b, during forging, a composite plate that consists of two layers of metal (that are respectively first metal and second metal) is placed on a profiling mold, and a mold cavity corresponding to a rib is disposed on a profiling forging mold. By forging, a second metal layer in the composite plate forms a middle plate 102 and a rib 1021, and the rib 1021 is disposed across the middle plate 102, and extends from one end of a bezel 101 to the other end of the bezel 101. In this manner, stiffness of the battery compartment can be further improved, and a metal volume proportion can be increased.

It may be understood that many complex structures may be formed by using a mold with a specific profile shape or an inner cavity shape in a forging process. For example, a profile shape with a cutting edge may be configured to implement separation (blanking) of a blank based on a profile line shape, and the inner cavity shape may be configured to obtain a corresponding stereoscopic shape of the blank. In this way, forging efficiency and structural precision of a semifinished part of a middle frame are greatly improved. The "profiling" in the profiling mold means that shape and structural features of the mold and the middle frame product are extremely matched. For example, a shape of a forged blank side wall is consistent with an outer arc of a middle frame side wall, and a processing residue greater than or equal to 0.20 mm is left, so that the forged semifinished part of the middle frame has a structural feature of high precision, for example, a rib.

The following describes a combination manner of the first metal and the second metal in this embodiment.

First, as a material of the outer layer structure 1012, the first metal is an appearance surface of the middle frame. When in use, contact time with a human skin is long. Therefore, the following requirements need to be met: a high stiffness requirement, surface treatment being physical vapor deposition (Physical Vapor Deposition, PVD) or anodic deposition, a relatively high elasticity modulus (greater than or equal to 68 Gpa), a good affinity for the human skin, and good molding performance of a hot forging process (an elongation rate is greater than or equal to 8%). Therefore, the first metal is preferably titanium alloy, stainless steel, and aluminum alloy. As the materials of the middle plate 102 and the inner layer structure 1011, the second metal is preferably aluminum alloy and magnesium alloy because of the following features of the aluminum alloy and the magnesium alloy: First, a light weight meets a light-weighting requirement. Second, a soft material facilitates machining. Third, compared with stainless steel and titanium alloy having high difficulty in nanopore corrosion and having a low binding force with plastic, the aluminum alloy and the magnesium alloy are easy to be corroded and have a high binding force with the plastic. Finally, compared with the stainless steel and the titanium alloy that affect heat dissipation performance of the entire device because of low heat conduction (less than or equal to 20 W/mK), heat dissipation performance of the aluminum alloy and the magnesium alloy is good. Therefore, the aluminum alloy and the magnesium alloy are suitable to be as the second material.

Table 1 provides five combination embodiments of the first metal and the second metal.

TABLE 1

Combination embodiments of the first metal and the second metal

| Serial number | First metal | Second metal |
| --- | --- | --- |
| 1 | Titanium alloy | Aluminum alloy |
| 2 | Titanium alloy | Magnesium alloy |
| 3 | Stainless steel | Aluminum alloy |
| 4 | Stainless steel | Magnesium alloy |
| 5 | Aluminum alloy | Magnesium alloy |

It may be understood that the combination embodiments of the first metal and the second metal are not limited to the foregoing five types.

It may be understood that grades of the titanium alloy, the stainless steel, the aluminum alloy, and the magnesium alloy may be selected based on an actual application, for example, grades of the titanium alloy (China National Standard GB/T) include TA1, TA2, TA3, and the like. Grades of the aluminum alloy (China National Standard GB/T) include 6061 aluminum alloy, 6013 aluminum alloy, 6065 aluminum alloy, and the like. This is not specifically limited in this application.

It may be understood that thickness selection of the composite plate may be matched based on a specific product feature combination, and this is not specifically limited in this application.

S02: Perform, in a machining manner, rough processing on the semifinished part of the middle frame obtained in S01 to form shape and inner cavity structure features.

This step provides a structural basis for in-mold injection molding in a next step. For example, as shown in FIG. 6, an antenna groove 1014 structure is formed so that the injection molding forms a plastic part 121.

S03: Perform, in nano molding (Nano Molding Technology, NMT) manner, nanopore corrosion on the semifinished part after the machining, and then perform in-mold injection molding to complete plastic filling of the antenna groove and a partial area of the middle plate.

In the manufacturing method for a middle frame provided in this embodiment of this application, the two-layer bezel structure that consists of the inner layer structure and the outer layer structure is obtained in the processing manner of hot forging the composite plate, so as to increase the metal volume proportion of the middle frame and further improve stiffness. In addition, a bezel structure and a middle plate structure are obtained, which can avoid that the middle frame is obtained in a split (including welding or riveting) manner, so that a processing step of the middle frame is reduced, machining time is reduced, and costs are reduced. In addition, in a solution of hot forging the composite plate, deformation resistance is reduced by heating, so that the semifinished part with a thickness greater than 5 mm can be formed, thereby increasing the metal volume proportion of the middle frame by increasing a material thickness, and further improving the stiffness. The outer profile uses a manner of forging the profiling mold to perform partial forming and obtain a required shape, so as to reduce a subsequent machining amount, thereby reducing costs.

According to the middle frame and the manufacturing method for a middle frame provided in the foregoing embodiments, this application provides the following two different specific implementations of the composite plate corresponding to the middle frame:

Implementation a: The first metal of the composite plate is selected as TA2 titanium, and the second metal of the composite plate is selected as 6013 aluminum alloy. TA2 can form a dense oxide thin film on a surface, and an oxide thereof has a very stable chemical property, does not corrode in an organism, does not affect a biological nerve and electrochemical reaction, has good biocompatibility with human beings, and is skin-friendly. TA2 titanium strength is relatively good. so that the strength and the stiffness of the entire device are effectively improved, a differentiated appearance of a mobile phone is further implemented, and competitiveness is improved. The 6013 aluminum alloy has a low density (2.7 $g/cm^3$) and a light weight, which is beneficial to the weight reduction of a housing and the entire device. By setting the bezel as a structure with two layers of different density features, a maximum thickness of the middle frame provided in this embodiment may be up to 4.6 mm, so as to solve the problem that the overall stiffness of the electronic device is weak because of a small metal proportion of the bezel. In this implementation, light weighting is ensured and an effect of a titanium alloy appearance surface is implemented.

Implementation b: The first metal of the composite plate is selected as 6013 aluminum alloy, and the second metal of the composite plate is selected as ZK61M magnesium alloy. The 6013 aluminum alloy has a low density ($\rho$=2.7 $g/cm^3$) and a light weight. A soft material is easier to be processed by machining than the titanium and the stainless steel. Appearance surface treatment is generally an anodic process, which can implement different appearance effects. The ZK61M magnesium alloy has a lower density ($\rho$=1.8 $g/cm^3$), which is beneficial to the weight reduction of the housing and the entire device. By disposing the bezel as a structure with two layers of different density features, a maximum thickness of the bezel provided in this embodiment may be up to 6.1 mm, so as to solve the problem that the overall stiffness of the electronic device is weak because of a small metal proportion of the bezel. In this implementation, light weighting is ensured and the heat dissipation requirement is met. Compared with the implementation a, the weight is lighter.

The following first describes the structural feature of the middle frame in the implementation a.

In a manner that an inner structural feature (including the middle plate 102, the inner layer structure 1011, and the rib 1021) is implemented by using lightweight metal such as 6013 aluminum alloy, and the TA2 titanium alloy is used as a bezel appearance surface (that is, the outer layer structure 1012), when a primary body part of the bezel consists of the aluminum alloy and the titanium alloy, a thickness of the titanium alloy is less than or equal to 2 mm. Therefore, a weight reduction effect is implemented under a titanium alloy appearance condition. In this way, light weighting is ensured and an effect of the titanium alloy appearance surface is implemented, so as to meet the requirement of structural strength and stiffness, and further meet the heat dissipation requirement. When other parts of the bezel and a primary body of the middle plate are the aluminum alloy, the aluminum alloy is relatively soft in material, and therefore, machining time is greatly shortened. The middle frame provided in this application is bound to plastic, and a main part is the aluminum alloy, so that good binding performance is obtained. In addition, compared with a current middle frame, a middle frame processing method provided in this application can avoid that the middle frame is obtained in the split (including welding or riveting) manner, so that a step is reduced, the machining time is reduced, and the costs are reduced.

In this implementation, the middle frame includes the bezel and the middle plate, and the bezel is of an annular structure and is disposed around the edge of the middle plate. The bezel consists of the inner layer structure and the outer layer structure. The material of the outer layer structure is the TA2 titanium, and the materials of the middle plate and the inner layer structure are the 6013 aluminum alloy. Therefore, 90% of the volume of the bezel part and 70% of the volume of the middle plate part are metal, the rest is plastic, and a type of the plastic is PBT+30% GF. There is a clear interface between the TA2 titanium and the 6013 aluminum under a metallographic microscope. The TA2 titanium on the bezel is of a non-uniform thickness, and a maximum thickness is 0.6 mm. The 6013 aluminum alloy is of a non-uniform thickness, and a maximum thickness is 4.0 mm. A maximum thickness of the middle frame provided in this embodiment may be up to 4.6 mm.

A middle frame processing process shown in the implementation a is as follows:

S011: Obtain a two-layer composite plate with a thickness of 6 mm by accumulative rolling.

In the composite plate, a first layer is first metal titanium TA2, a thickness of TA2 is 1.5 mm, a second layer is second metal aluminum alloy 6013, and a thickness of AL6013 is 4.5 mm. TA2 is in an M state (a fully annealed state), and the 6013 aluminum alloy is in an O state (a fully annealed state).

S012: Forge the composite plate by using hot die forging to obtain the semifinished part of the middle frame.

The material of the outer layer structure of the semifinished part of the middle frame is the TA2 titanium, and the materials of the inner layer structure and the middle frame structure are the 6013 aluminum alloy. It may be understood that in this embodiment, a required box-shaped structure may be formed by forging once or forging a plurality of times. Further, in a profiling hot forging manner, a back extrusion rib is disposed in a mold, so that in a hot forging process, a rib is generated on the middle plate, and a material of the rib is the 6013 aluminum alloy.

Optionally, a sidewall necking forging is performed on the foregoing semifinished part of the middle frame. As shown in FIG. 5b, the inner layer structure and the outer layer structure form a required curvature (that is, a bending degree of a circular arc), that is, a cross section of the outer layer structure is a sector ring shape (a sector ring is a part of a circular ring that is cut off by a sector) and is attached to an outer side of the inner layer structure 1011. A concavo-convex fit is implemented between an inner arc of the outer layer structure 1012 and an outer arc of the inner layer structure 1011, so that the outer layer structure 1012 is tightly attached to the inner layer structure 1011, and the outer layer structure 1012 is clamped to the inner layer structure 1011. In this way, the outer layer structure 1012 cannot move up and down relative to the inner layer structure 1011, and a case in which structures are separated from each other is not prone to occur in the bezel 101 that consists of the inner layer structure 1011 and the outer layer structure 1012. It may be understood that in this embodiment, the required curvature may be obtained by forging once or forging a plurality of times.

S013: Perform heat treatment on the foregoing semifinished part after the hot forging.

In a specific embodiment, the heat treatment includes the following steps:

S301: Perform first heat treatment. Temperature is selected as 530° C., a holding time is 1.5 hours, and water cooling, water fog cooling, or air cooling may be selected. In this case, the TA2 titanium alloy is in an annealed state (M) after completing annealing treatment. The 6013 aluminum alloy is in a solid solution state (W) after completing solid solution treatment.

S302: Perform second treatment. The temperature is selected as 180° C., the holding time is 8 hours, and an air cooling manner is selected. In this case, the TA2 titanium alloy remains in the annealed state. The 6013 aluminum alloy completes aging treatment and is in a peak aging state (T6).

S014: Shape the semifinished part after the heat treatment in a cold forging manner, so as to increase size precision of an outer sidewall profile and the inner structural feature.

S015: Perform a first machining step to form an injection molding position by machining.

S016: Perform in-mold injection molding.

In a specific embodiment, the in-mold injection molding includes the following steps:

S601: Perform nanopore corrosion, that is, perform nanopore corrosion on the 6013 aluminum alloy part of the semifinished part after the first machining step is completed. Because of strong corrosion resistance of the TA2 titanium alloy, a TA2 titanium alloy structure is not affected in a process.

S602: Perform in-mold injection molding, that is, complete plastic filling of an antenna groove and a partial area of the middle plate. The plastic may be PBT+30% GF.

S017: Perform second machining step. Shape and cavity structural features are formed by using a plurality of times of machining to meet a size precision requirement.

S018: Perform anti-corrosion treatment on the 6013 aluminum alloy. Perform film processing on a formed mechanical part. The 6013 aluminum alloy completes anti-corrosion treatment, and the TA2 titanium alloy is not affected.

S019: Perform appearance treatment. Perform sanding, polishing, or PVD treatment on the appearance surface to obtain required surface roughness.

S0110: Perform a subsequent process. Perform a process such as partial laser carving, spring welding, and auxiliary material attaching to assemble the middle frame and middle plate components.

The following describes the structural feature of the middle frame in the implementation b.

The material of the outer layer structure is set as the T6013 aluminum alloy, and the materials of the inner layer structure and the middle plate structure are set as the ZK61M magnesium alloy. In this way, light weighting is ensured and the heat dissipation requirement is met. In addition, compared with a current middle frame, a middle frame processing method provided in this application can avoid that the middle frame is obtained in the split (including welding or riveting) manner, so that a step is reduced, the machining time is reduced, and the costs are reduced.

In this implementation, the middle frame includes the bezel and the middle plate, and the bezel is of an annular structure and is disposed around the edge of the middle plate. The bezel consists of the inner layer structure and the outer layer structure. Therefore, 95% of the volume of the bezel part and 65% of the volume of the middle plate part are metal, the rest is plastic, and a type of the plastic is PBT+35% GF. The bezel part includes two types of metal, the outer layer structure is the 6013 aluminum alloy, and the inner layer structure is the ZK61M magnesium alloy. There is a clear interface between the 6013 aluminum alloy and the ZK61M magnesium alloy under the metallographic microscope. The 6013 aluminum alloy on the bezel is of a non-uniform thickness, and a maximum thickness is 1.6 mm. The ZK61M magnesium alloy is of a non-uniform thickness, and a maximum thickness is 4.5 mm. A maximum thickness of the middle frame provided in this embodiment may be up to 6.1 mm.

A middle frame processing process shown in the implementation b is as follows:

S021: Obtain a two-layer composite metal plate by using hot accumulative rolling.

In the composite plate, a first layer is first metal 6013 aluminum alloy (a thickness is 2.0 mm), and a second layer is second metal ZK61M magnesium alloy (a thickness is 4.0 mm).

Annealing is performed after the accumulative rolling, and the 6013 aluminum alloy and the ZK61M magnesium alloy are in an O state (a fully annealed state).

S022: Forge the composite plate by using hot die forging to obtain the semifinished part of the middle frame.

The material of the outer layer structure is the T6013 aluminum alloy, and the materials of the inner layer structure and the middle plate structure are the ZK61M magnesium alloy.

In a specific implementation, in a profiling hot forging manner, a back extrusion rib is disposed on a forging mold, so that in a hot forging process, a rib is generated on the middle plate, and a material of the rib is the ZK61M magnesium alloy.

Optionally, sidewall forging is performed on the semifinished part of the foregoing middle frame to form a required curvature structure. It may be understood that in this embodiment, the required curvature may be obtained by forging once or forging a plurality of times.

S023: Perform heat treatment, that is, perform heat treatment on the foregoing semifinished part after the hot forging.

In a specific embodiment, the heat treatment includes the following steps:

S2301: Perform first heat treatment. Temperature is selected as 450° C., a holding time is 2 hours, and air cooling is performed to reach the room temperature.

S2302: Perform second treatment. The temperature is selected as 165° C., the holding time is 24 hours, and then air cooling is performed to reach the room temperature.

S024: Perform cold shaping, that is, shape the semifinished part after the heat treatment in the cold forging manner, so as to increase size precision of an outer sidewall profile and inner structural feature.

S025: Perform a first machining step, to form an injection molding position by machining.

S026: Perform in-mold injection molding.

In a specific embodiment, the in-mold injection molding includes the following steps:

S2601: Perform nanopore corrosion, that is, perform nanopore corrosion on the ZK61M magnesium alloy of the semifinished part after the first machining step is completed.

S2602: Perform in-mold injection molding, that is, complete plastic filling of an antenna groove and a partial area of the middle plate. The plastic may be PA+35% GF.

S027: Perform a second machining step, that is, the shape and the cavity structural feature are formed by using a plurality of times of machining, and specific redundancy is left.

S028: Perform masking treatment, that is, perform electrophoresis or coating treatment on a formed mechanical part.

S029: Perform appearance treatment, that is, perform sanding, polishing, and anodizing treatment on an appearance surface to obtain a required appearance effect, and then remove protective ink or electrophoretic paint from another position, and then perform film processing on the faded ink part.

S0210: Perform a subsequent process, that is, perform a process such as partial laser carving, spring welding, and auxiliary material attaching to assemble the middle frame and middle plate structure components.

In the foregoing two implementations, by disposing the bezel as a structure with two layers of different density features, a maximum thickness of the middle frame may be up from 4.6 mm to 6.1 mm, so as to solve the problem that the overall stiffness of the electronic device is weak because of a small metal proportion of the bezel.

Figure 8A:
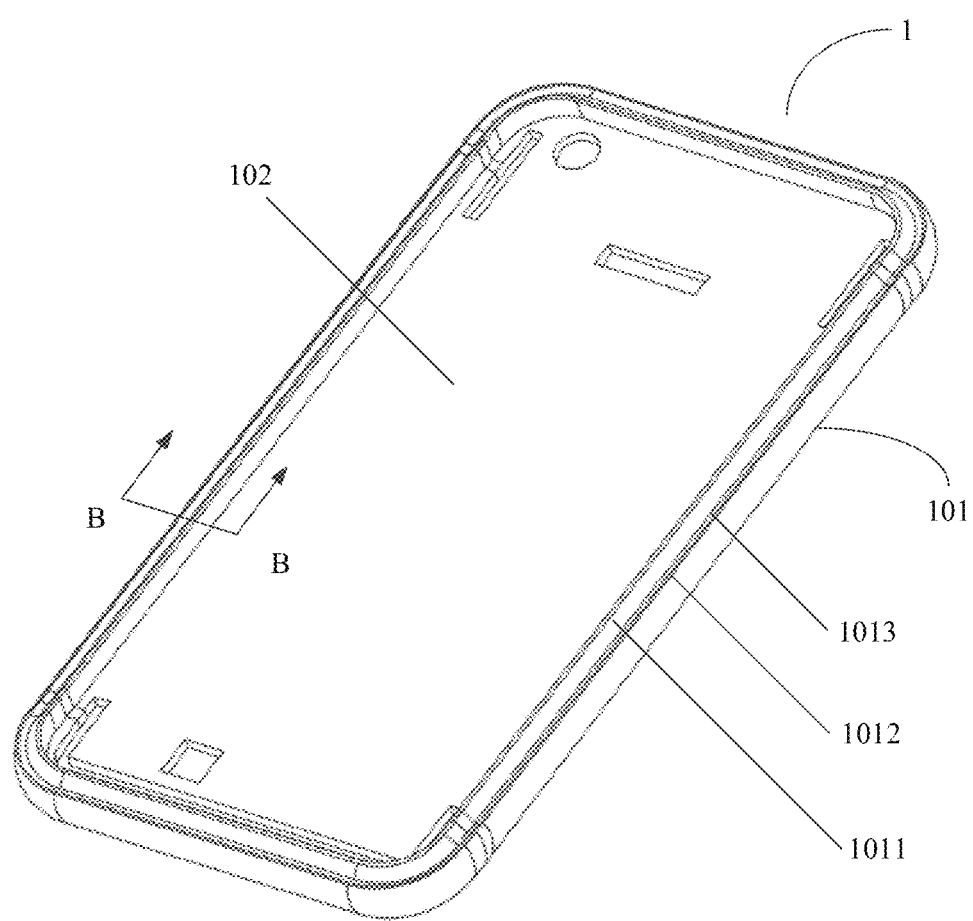
FIG. 8a is a schematic diagram of a structure of another embodiment of a middle frame according to an embodiment of this application.

With reference to the accompanying drawings, the following introduces a second middle frame according to an embodiment of this application, FIG. 8a is a schematic diagram of a structure of another embodiment of a middle frame according to an embodiment of this application.

As shown in FIG. 8a, the middle frame 1 includes a bezel 101 and a middle plate 102. The bezel 101 is of an annular structure and is disposed around an edge of the middle plate 102. The bezel 101 consists of an inner layer structure 1011, an outer layer structure 1012, and a middle layer structure 1013.

Figure 8B:
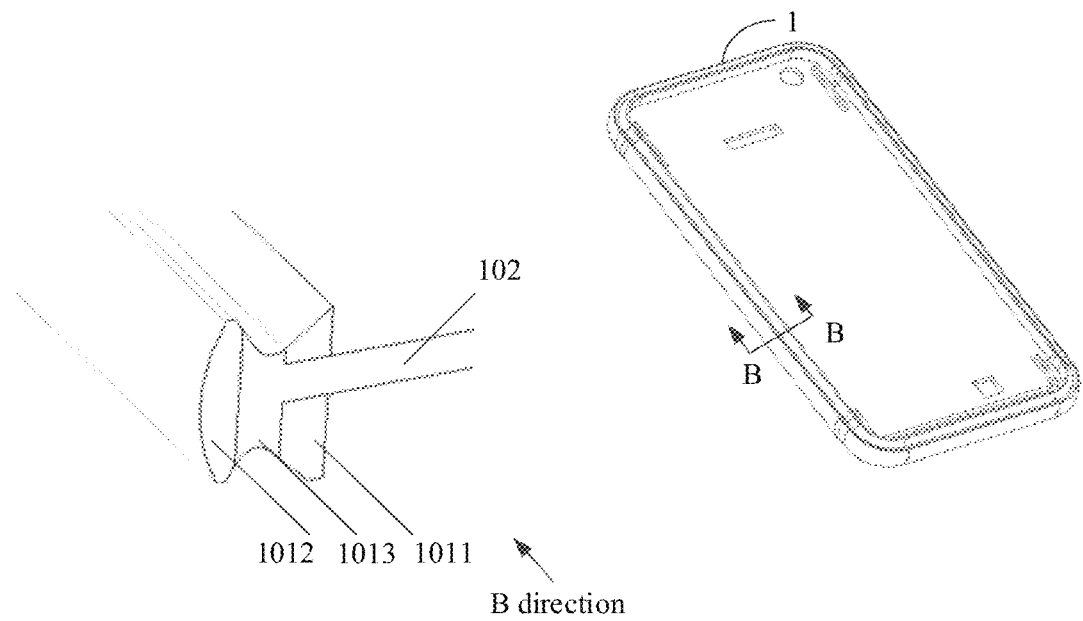

FIG. 8b is a schematic sectional view of a B-B part of the middle frame shown in FIG. 8a. As shown in FIG. 8b, a cross-section of the outer layer structure 1012 may be arched, the outer layer structure 1012 is attached to an outer side of the middle layer structure 1013, and the outer layer structure 1012 cannot move up and down relative to the middle layer structure 1013. The foregoing "outer" refers to a direction outside an electronic device in which the middle frame is located. The inner layer structure 1011 and the middle plate 102 are disposed on a side of the middle layer structure 1013 that is away from the outer layer structure 1012. The inner layer structure 1011 is attached to the middle layer structure 1013, and the inner layer structure 1011 cannot move up and down relative to the middle layer structure 1013. It may be understood that, by controlling a binding force, a case in which structures are separated from each other is not prone to occur in the bezel 101 that consists of the inner layer structure 1011, the outer layer structure 1012, and the middle layer structure 1013. A material of the outer layer structure 1012 is first metal, materials of the middle plate 102 and the inner layer structure 1011 are second metal, and a material of the middle layer structure 1013 is third metal.

It may be understood that a radian of the outer side of the outer layer structure 1012 is for meeting an appearance requirement, and a radian size is not limited in this application.

It may be learned from the foregoing embodiments that the bezel of the middle frame provided in the embodiment of this application is set as a three-layer structure, which increases a metal volume proportion of the bezel, thereby improving stiffness of an entire device. In addition, by adding the third metal, bonding strength of a composite plate (that is, the first metal, the second metal, and the third metal) can be improved. Because bonding strength of a part of the first metal and the second metal is relatively low after combining, that is, bonding strength of the first metal and the second metal that are directly combined is less than 400 Mpa, when bonding strength of the first metal and the third metal is greater than 400 Mpa and bonding strength of the second metal and the third metal is greater than 400 Mpa, bonding strength of each part can be greater than 400 Mpa because of the added third metal, and can be greater than strength of the first metal and the second metal that are directly combined. In the middle frame provided in this embodiment, a material of a structure of more than 60% of a volume is metal, the material of the outer layer structure is the first metal, the materials of the middle plate and the inner layer structure are the second metal, and the material of the middle layer structure is the third metal. A thickness of the third metal should be less than or equal to 1.0 mm, and less than 40% of the volume is plastic that includes a plastic part disposed in an antenna groove on the bezel and plastic of a partial structure of the middle plate. The plastic of the antenna groove and the partial area of the middle plate may be PPS, PBT, PA, PPA, or another type of resin, and a glass fiber with a content of 10% to 60% by weight is added based on needs.

In an embodiment, the inner layer structure 1011, the middle layer structure 1013, and the outer layer structure 1012 are an integrated structure. Preferably, in an implementation, the inner layer structure 1011, the middle layer 1013, and the outer layer structure 1012 that are integrally formed are obtained in a processing manner of forging the composite plate. In this way, the inner layer structure 1011, the middle layer structure 1013, and the outer layer structure 1012 are respectively three different metal materials, and a connection in a welding or riveting manner can be avoided. It may be understood that the composite plate herein includes an upper layer plate, a middle layer plate, and a lower layer plate that are constituted by three types of metal.

In an embodiment, the middle plate 102 and the middle layer structure 1011 are an integrated structure. Preferably, the middle plate 102 and the middle layer structure 1011 are obtained in the processing manner of forging the composite plate.

Figure 9:
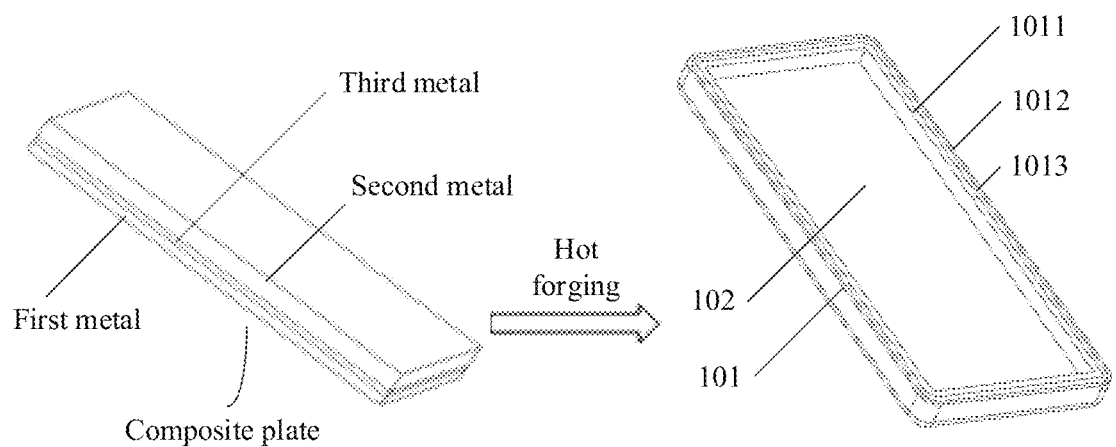
FIG. 9 is a schematic diagram of still another embodiment of a manufacturing method for a middle frame according to an embodiment of this application.

To implement a structural setting of the foregoing second middle frame, this application provides a manufacturing method for a middle frame. FIG. 9 is a schematic diagram of still another embodiment of a middle frame technological process according to an embodiment of this application. As shown in FIG. 9, the manufacturing method for a middle frame includes:

S001: Obtain a semifinished part of the middle frame in a processing manner of hot forging a composite plate that consists of three layers of metal (that are respectively first metal, second metal and third metal).

The semifinished part of the middle frame includes a bezel 101 and a middle plate 102. The bezel 101 is of an annular structure and is disposed around an edge of the middle plate 102, and the bezel 101 consists of an inner layer structure 1011, an outer layer structure 1012, and a middle layer structure 1013.

It may be understood that, in a manner of hot forging the composite plate, a structure formed by the first metal, the second metal, and the third metal is an integrated structure by controlling a related parameter such as a binding force. Referring to FIG. 8b, there is a clear interface between the first metal, the second metal, and the third metal under a metallographic microscope. A material of the outer layer structure 1012 is the first metal, materials of the middle plate 102 and the inner layer structure 1011 are the second metal, and a material of the middle layer structure 1013 is the third metal. Optionally, in a profiling hot forging manner, a back extrusion rib is disposed in a mold, so that in a hot forging process, a rib 1021 is generated on the middle plate 102.

The following describes a combination manner of the first metal, the second metal, and the third metal in this embodiment. Table 2 provides five combination embodiments of the first metal, the second metal, and the third metal.

TABLE 2

Combination embodiments of the first metal, the second metal, and the third metal

| Serial number | First metal | Second metal | Third metal |
| --- | --- | --- | --- |
| 1 | Titanium alloy | Magnesium alloy | Aluminum alloy |
| 2 | Titanium alloy | Aluminum alloy 1 | Aluminum alloy 2 |
| 3 | Stainless steel | Magnesium alloy | Aluminum alloy |
| 4 | Stainless steel | Aluminum alloy 1 | Aluminum alloy 2 |
| 5 | Aluminum alloy 1 | Magnesium alloy | Aluminum alloy 2 |

Referring to Table 2, it may be understood that the combination embodiments of the first metal, the second metal, and the third metal are not limited to the foregoing five types. The aluminum alloy 1 and the aluminum alloy 2 refer to aluminum alloys of different grades, and 1 and 2 do not have actual definition meaning, and are only used for distinguishing.

It may be understood that an alloy grade may be selected according to an actual application, which is not specifically limited in this application.

It may be understood that thickness selection of the composite plate may be used to perform combination matching of a semifinished part thickness according to a specific product. In a specific embodiment, when the first metal is stainless steel or titanium alloy, the second metal is magnesium alloy, and the third metal is aluminum alloy, the thickness should be less than or equal to 1.0 mm.

After S001 is completed for the middle frame in this embodiment, for subsequent processing step S002, refer to S02 shown in the first embodiment of a middle plate processing method, and for processing step S003, refer to S03 shown in the first embodiment of the middle plate processing method. Details are not described herein again.

It can be learned from the foregoing embodiments that, as shown in Table 2, in the middle frame provided in this application, an inner structural feature (that includes the middle plate 102, the inner layer structure 1011, and the rib 1021) is implemented by using lightweight metal such as the aluminum alloy or the magnesium alloy, and in a manner that a middle layer structure feature (the middle layer structure 1013) is implemented by using the lightweight metal such as the aluminum alloy or the magnesium alloy, and the stainless steel or the titanium alloy are used as a bezel appearance surface (that is, the outer layer structure 1012), a binding force between all layers of structures is increased, thereby resolving a problem that overall stiffness of an electronic device is weak because of a small metal proportion of the bezel. In addition, light weighting is ensured and an appearance surface effect of the stainless steel or the titanium alloy is implemented, and a heat dissipation requirement is met. In addition, compared with a current middle frame, a middle frame processing method provided in this application can avoid that the middle frame is obtained in a split (including welding or riveting) manner, so that a step is reduced, machining time is reduced, and costs are reduced.

According to the middle frame and the manufacturing method for a middle frame provided in the foregoing embodiments, this application provides a specific implementation: Implementation c: A composite plate with the first metal as TA4 titanium, the second metal as AZ31B magnesium alloy, and the third metal as 1050 aluminum is selected to manufacture the middle frame.

The following describes the structural feature of the middle frame in the implementation c.

The inner structural feature (that includes the middle plate 102, the inner layer structure 1011, and the rib 1021) is implemented by using lightweight metal such as the AZ31B magnesium alloy, and in a manner that the middle layer structural feature (the middle layer structure 1013) is implemented by using 1050 aluminum, and the TA4 titanium is used as a bezel appearance surface (that is, the outer layer structure 1012), when another part of the bezel and a primary body of the middle plate are the aluminum alloy or the magnesium alloy, machining time is greatly shortened because a material of the aluminum alloy or that of the magnesium alloy is soft. In addition, light weighting is ensured and the appearance surface effect of the stainless steel or the titanium alloy is implemented, so as to meet a requirement of structural strength and stiffness, and further meet the heat dissipation requirement.

In this implementation, the middle frame includes the bezel and the middle plate, and the bezel is of an annular structure and is disposed around the edge of the middle plate. The bezel consists of the inner layer structure, the outer layer structure, and the middle layer structure. 85% of the volume of the bezel part and 80% of the volume of the middle plate part are metal, the rest is plastic, and a material is PA+55% GF. The bezel part includes three types of metal, the first metal is the TA4 titanium, the second metal is the AZ31B magnesium alloy, and the third metal is the 1050 aluminum. There is a clear interface between the TA4 titanium, the 1050 aluminum, and the AZ31B magnesium under a metallographic microscope. The TA4 titanium on the bezel is of a non-uniform thickness, and a maximum thickness is 1.2 mm. The 1050 aluminum is of a uniform thickness of 0.3 mm. The AZ31B aluminum alloy is of a non-uniform thickness, and a maximum thickness is 4.5 mm. A maximum thickness of the middle frame provided in this embodiment may be up to 4.8 mm.

A middle frame processing process shown in this implementation c is as follows:

S0011: Obtain a three-layer composite metal plate by using hot accumulative rolling.

In the composite plate, a first layer is first metal TA4 titanium (a thickness is 2.0 mm), a second layer is third metal 1050 aluminum (a thickness is 0.3 mm), and a third layer is second metal AZ31B magnesium alloy (a thickness is 5.0 mm).

Annealing is performed after the accumulative rolling, the TA4 is in an M state (a fully annealed state), and the 1050 aluminum and the AZ31B magnesium alloy are in an O state (a fully annealed state).

S0012: Forge the composite plate by using hot die forging to obtain the semifinished part of the middle frame.

The material of the outer layer structure of the semifinished part of the middle frame is the TA4 titanium, and the materials of the inner layer structure and the middle plate structure are the AZ31B magnesium alloy, and the material of the middle layer structure is the 1050 aluminum. It may be understood that in this embodiment, a required structural feature may be formed by forging once or forging a plurality of times. Further, in a profiling hot forging manner, a back extrusion rib is disposed in a mold, so that in a hot forging process, a rib is generated on the middle plate, and a material of the rib is the AZ31B magnesium alloy.

Optionally, sidewall forging is performed on the semifinished part of the foregoing middle frame to form a required curvature structure. It may be understood that in this embodiment, the required curvature may be obtained by forging once or forging a plurality of times.

S0013: Perform heat treatment, that is, perform heat treatment on the foregoing semifinished part after the hot forging: temperature is selected as 350° C., and a holding time is 2 hours.

S0014: Perform cold shaping, that is, shape the semifinished part after the heat treatment in the cold forging manner, so as to increase size precision of an outer sidewall profile and the inner structural feature.

S0015: Perform a first machining step, to form an injection molding position by machining.

S0016: Perform in-mold injection molding.

In a specific embodiment, the in-mold injection molding includes the following steps:

S0601: Perform nanopore corrosion. Perform nanopore corrosion on the AZ31B magnesium alloy part of the semifinished part after the first machining step is completed.

S0602: Perform in-mold injection molding. Complete plastic filling of an antenna groove and a partial area of the middle plate. The plastic may be PA+55% GF.

S0017: Perform a second machining step, that is, shape and cavity structural features are formed by using a plurality of times of machining to meet a size precision requirement.

S0018: Perform anti-corrosion treatment on the aluminum alloy, that is, perform film processing on a formed mechanical part, and the AZ31B aluminum alloy completes the anti-corrosion treatment.

S0019: Perform appearance treatment, that is, perform sanding, polishing, or PVD treatment on the appearance surface to obtain required surface roughness.

S00110: Perform a subsequent process, that is, perform a process such as partial laser carving, spring welding, and auxiliary material attaching to assemble the middle frame and middle plate components.

According to the middle frame provided in this implementation, the material of the outer layer structure is the TA4 titanium, and the materials of the inner layer structure and the middle plate structure are the AZ31B magnesium alloy, the material of the middle layer structure is the 1050 aluminum, and a maximum thickness may be up to 4.8 mm, thereby resolving a problem that overall stiffness of an electronic device is weak because of a small metal proportion of the bezel.

In the foregoing two embodiments of the manufacturing method for a middle frame, to meet the size precision requirement and a processing requirement of a product, the processing steps further include a heat treatment step and two machining steps. The heat treatment step is set after S01 and before S02. The two machining steps are set after S03. To meet an appearance requirement and an anti-corrosion requirement of the product, the processing steps further include a masking treatment step and a surface treatment step, where the masking treatment step is set after the two machining steps, and the surface treatment step is set after the masking treatment step. In some embodiments, a zero shaping step may alternatively be set after the heat treatment step. In addition, a step such as partial laser carving, spring welding, and/or auxiliary material attaching may be set after the surface treatment step. In addition, when an appearance part is selected as the stainless steel or the titanium alloy, appearance treatment is PVD. When the appearance part is selected as the aluminum alloy, appearance treatment is selected as anodizing.

The invention claimed is:

1. An electronic device, comprising:
a middle frame, wherein the middle frame comprises a bezel and a middle plate,
wherein the bezel is of an annular structure and is disposed around an edge of the middle plate, and the bezel comprises at least three layers of annular structures,
wherein any two adjacent annular structures in the at least three layers of annular structures are mutually attached, so as to locate the annular structure,
wherein the at least three layers of annular structures comprise a middle layer structure, and
wherein the at least three layers of annular structures are respectively made of at least three metal materials of different densities.

2. The electronic device according to claim 1,
wherein the at least three layers of annular structures comprise an inner layer structure and an outer layer structure,
wherein the outer layer structure is attached to an outer side of the inner layer structure, the outer side is a side away from the middle frame, and a density of the outer layer structure is greater than a density of the inner layer structure, and
wherein the inner layer structure and the middle plate are an integrated structure.

3. The electronic device according to claim 2, wherein a thickness of the inner layer structure in a horizontal direction of the middle frame is greater than a thickness of the outer layer structure in the horizontal direction of the middle frame.

4. The electronic device according to claim 3,
wherein the middle layer structure is disposed between the inner layer structure and the outer layer structure, a binding force of the middle layer structure and the outer layer structure is greater than a binding force of the outer layer structure and the inner layer structure, and a binding force of the middle layer structure and the inner layer structure is greater than the binding force of the outer layer structure and the inner layer structure.

5. The electronic device according to claim 2, further comprising:
a rib,
wherein the rib is disposed on the middle plate, and two ends of the rib are respectively connected to an inner side of the bezel, wherein the rib, the middle plate, and the inner layer structure surround to form a first accommodating space, and the first accommodating space is configured to accommodate a battery, and wherein the rib and the middle plate are of the integrated structure.

6. The electronic device according to claim 1, further comprising:

an antenna groove, wherein the antenna groove is disposed on the bezel, wherein a plastic part is disposed in an injection molding manner on the antenna groove, and wherein the plastic part is connected to the bezel and the middle plate.

7. An electronic device, comprising:

a middle frame, wherein the middle frame comprises a bezel and a middle plate, wherein the bezel is of an annular structure and is disposed around an edge of the middle plate, and the bezel comprises at least two layers of annular structures, wherein any two adjacent annular structures in the at least two layers of annular structures are mutually attached, so as to locate the annular structure, wherein the at least two layers of annular structures comprise an inner layer structure and an outer layer structure, wherein the inner layer structure includes a first arc surface that protrudes in a direction away from the middle frame, the first arc surface being further away from the middle frame than an inner surface of the inner layer structure, wherein the outer layer structure includes a second arc surface attached to the first arc surface, and wherein the second arc surface matches a shape and a size of the first arc surface.

8. The electronic device according to claim 7, wherein the at least two layers of annular structures are respectively at least two metal materials of different densities.

9. The electronic device according to claim 7, wherein the outer layer structure is attached to an outer side of the inner layer structure, the outer side is a side away from the middle frame, and a density of the outer layer structure is greater than a density of the inner layer structure, and wherein the inner layer structure and the middle plate are an integrated structure.

10. The electronic device according to claim 9, wherein a thickness of the inner layer structure in a horizontal direction of the middle frame is greater than a thickness of the outer layer structure in the horizontal direction of the middle frame.

11. The electronic device according to claim 10, wherein the at least two layers of annular structures further comprise a middle layer structure, and wherein the middle layer structure is disposed between the inner layer structure and the outer layer structure, a binding force of the middle layer structure and the outer layer structure is greater than a binding force of the outer layer structure and the inner layer structure, and a binding force of the middle layer structure and the inner layer structure is greater than the binding force of the outer layer structure and the inner layer structure.

12. The electronic device according to claim 9, further comprising:

a rib, wherein the rib is disposed on the middle plate, and two ends of the rib are respectively connected to an inner side of the bezel, wherein the rib, the middle plate, and the inner layer structure surround to form a first accommodating space, and the first accommodating space is configured to accommodate a battery, and wherein the rib and the middle plate are of the integrated structure.

13. The electronic device according to claim 7, further comprising:

an antenna groove, wherein the antenna groove is disposed on the bezel, wherein a plastic part is disposed in an injection molding manner on the antenna groove, and wherein the plastic part is connected to the bezel and the middle plate.

14. The electronic device according to claim 7, wherein a first height of the first arc surface of the inner layer structure is less than a second height of the inner surface of the inner layer structure.

15. An electronic device, comprising:

a middle frame, wherein the middle frame comprises a bezel and a middle plate, wherein the bezel is of an annular structure and is disposed around an edge of the middle plate, and the bezel comprises at least two layers of annular structures, wherein the at least two layers of annular structures comprise an inner layer structure and an outer layer structure, and wherein a thickness of the inner layer structure in a horizontal direction of the middle frame is greater than a thickness of the outer layer structure in the horizontal direction of the middle frame, and wherein a density of the outer layer structure is greater than a density of the inner layer structure.

16. The electronic device according to claim 15, wherein the outer layer structure is attached to an outer side of the inner layer structure, the outer side is a side away from the middle frame, and a density of the outer layer structure is greater than a density of the inner layer structure, and wherein the inner layer structure and the middle plate are an integrated structure.

17. The electronic device according to claim 15, wherein the at least two layers of annular structures further comprise a middle layer structure, and wherein the middle layer structure is disposed between the inner layer structure and the outer layer structure, a binding force of the middle layer structure and the outer layer structure is greater than a binding force of the outer layer structure and the inner layer structure, and a binding force of the middle layer structure and the inner layer structure is greater than the binding force of the outer layer structure and the inner layer structure.

18. The electronic device according to claim 15, further comprising:

a rib, wherein the rib is disposed on the middle plate, and two ends of the rib are respectively connected to an inner side of the bezel, wherein the rib, the middle plate, and the inner layer structure surround to form a first accommodating space, and the first accommodating space is configured to accommodate a battery, and wherein the rib and the middle plate are an integrated structure.

19. The electronic device according to claim 15, further comprising:
   an antenna groove,
   wherein the antenna groove is disposed on the bezel,
   wherein a plastic part is disposed in an injection molding manner on the antenna groove, and
   wherein the plastic part is connected to the bezel and the middle plate.

20. The electronic device according to claim 15, wherein any two adjacent annular structures in the at least two layers of annular structures are mutually attached, so as to locate the annular structure.

21. The electronic device according to claim 15, wherein the at least two layers of annular structures are respectively at least two metal materials of different densities.

* * * * *